WITNESSES
Edwin C. Baseler
Leon M. Garman

INVENTOR
Brenton C. Knudson
BY F. H. Murray
ATTORNEY

Jan. 23, 1962 B. C. KNUDSON 3,018,446

SERIES ENERGIZED TRANSISTOR AMPLIFIER

Filed Sept. 14, 1956

2 Sheets-Sheet 2

United States Patent Office 3,018,446
Patented Jan. 23, 1962

3,018,446

SERIES ENERGIZED TRANSISTOR AMPLIFIER

Brenton C. Knudson, Glen Burnie, Md., assignor to Westinghouse Electric Corporation, East Pittsburgh, Pa., a corporation of Pennsylvania Filed Sept. 14, 1956, Ser. No. 609,996
6 Claims. (Cl. 330—14)

This invention relates to a transistor amplifier and, more particularly, to a stabilized transistor amplifier capable of producing relatively high output voltages.

Prior to this invention, transistors had generally not been considered suitable for use in deflection amplifiers for electrostatically deflected cathode ray tubes because of the fact that their maximum voltage ratings are relatively low.

It is an object of this invention to provide a stabilized transistor deflection amplifier which overcomes this limitation.

Another object of this invention is to provide a stabilized transistor amplifier which will produce relatively high amplified output voltages.

A still further object of the invention lies in the provision of means, in a high voltage transistor amplifier employing a plurality of transistors, for maintaining the amplification factor of the transistors relatively constant.

The above and other objects and features of the invention will become readily apparent in the following detailed description taken in connection with the accompanying drawings which form a part of this specification and in which.

Figure 1:
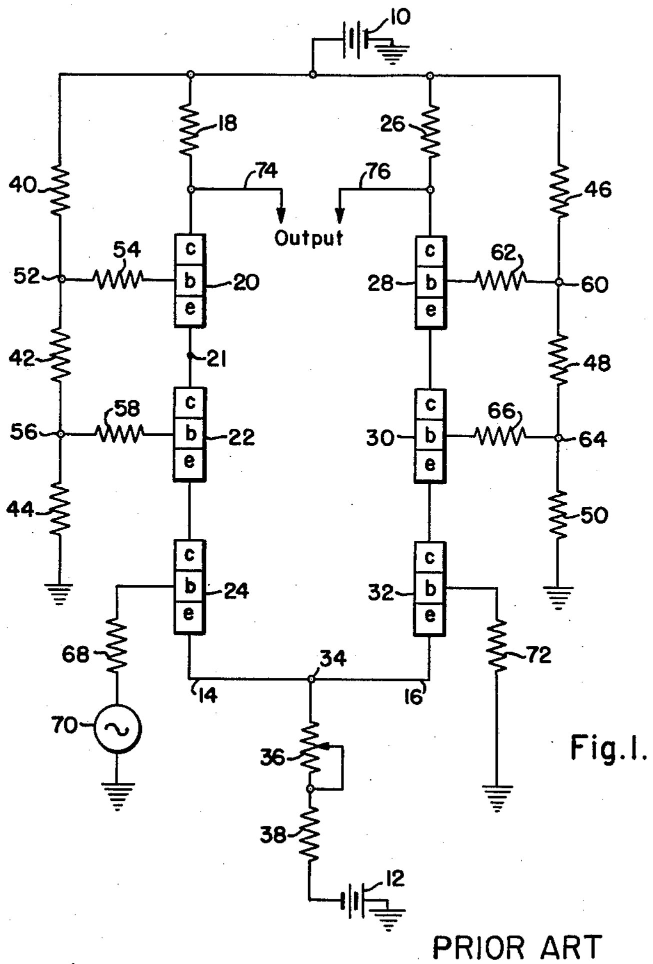
Fig.1. PRIOR ART
FIGURE 1 is a schematic electrical circuit diagram of a prior art transistor amplifier described and claimed in a copending application Serial No. 828,896, filed July 22, 1959, and is included to facilitate an understanding of the invention.

Referring to FIG. 1, the prior art circuit shown includes a source of positive potential, such as battery 10, and a source of negative potential, such as battery 12. It will be assumed that the voltages existing at the positive and negative terminals of batteries 10 and 12 are +300 volts and −300 volts, respectively. Consequently, the voltage drop between these two points is 600 volts. Between batteries 10 and 12 are connected two parallel current paths 14 and 16. Path 14 includes a resistor 18 and three n-p-n junction transistors 20, 22, and 24. Each of the transistors has an emitter, a collector, and a base indicated in the drawing by the letters *e*, *c*, and *b*, respectively. Similarly, path 16 includes resistor 26 and three n-p-n junction transistors 28, 30, and 32.

Paths 14 and 16 are joined at point 34 and connected through variable resistor 36 and resistor 38 to the negative terminal of battery 12. The positive terminal of battery 10 is connected through three dropping resistors: 40, 42 and 44 to ground. Point 52 between resistors 40 and 42 is connected to the base of transistor 20 through resistor 54; and point 56 is connected to the base of transistor 22 through resistor 58. Likewise, point 60 between resistors 46 and 48 is connected to the base of transistor 28 through resistor 62; and point 64 between resistors 48 and 50 is connected to the base of transistor 30 through resistor 66. The base of transistor 24 is connected through resistor 68 and a source of control potential 70 to ground. The base of transistor 32 is connected to ground potential through resistor 72, substantially as shown.

Resistors 18, 26, 36, and 38 are chosen so that when a quiescent current is flowing through each of the parallel paths 14 and 16, the voltage at each of the output terminals 74 and 76 will be +150 volts and the voltage at point 34 will be nearly zero. Consequently, the voltage differential between the output terminals 74 and 76 will be zero. Resistors 40, 42, and 44 are chosen so that the voltages at points 52 and 56 will be +200 volts and +100 volts, respectively. Likewise, resistors 46, 48, and 50 are chosen so that the voltages at points 60 and 64 will be +200 and +100 volts, respectively. Resistors 54, 62, 58 and 66 are chosen so that the voltage at the collectors of transistors 22 and 30 is +100 volts and that at the collectors of transistors 24 and 32 is +50 volts. Transistors 24 and 32 are similarly adjusted except that the bias current to these transistors is varied by adjusting the tap on resistor 36.

In the presence of a positive signal at the base of transistor 24, the emitter-to-collector impedance of the transistor and the voltage drop across it decreases. This has the effect of increasing the base current of transistor 22, thereby decreasing the impedance across transistor 22 and the voltage drop across it. In a similar manner, the base current of transistor 20 increases, lowering its impedance and the voltage drop across it. The voltage at output terminal 74, therefore, decreases and the current through resistor 18 and transistors 20—24 increases. This increase in the current through path 14 tends to increase the voltage drop across resistors 36 and 38, causing the emitter of transistor 32 in path 16 to become more positive. As the emitter of transistor 32 becomes more positive, its base current decreases, thereby increasing the impedance and voltage drop across it. This increase in the voltage across transistor 32 causes less base current to flow in transistor 30, resulting in an increase in its impedance and the voltage drop thereacross. In the same manner, the voltage across transistor 28 rises so that the overall effect is a substantial rise in the voltage at output terminal 76 with a corresponding drop in voltage at output terminal 74. The voltage differential between terminals 74 and 76 is determined by the magnitude of the positive signal applied to the base of transistor 24. The output for a negative input signal causes the opposite effect, resulting in a reversal of output voltage polarity. Since the saturation voltage of the transistors is quite low, it is possible to swing either output to nearly zero volts. If the breakdown voltage of the transistors in series is greater than the supply voltage, it is also possible to swing either side up to nearly 300 volts. Thus, the peak to peak output is almost 600 volts.

Although the circuit shown in FIG. 1 will operate satisfactorily for its indicated function, it suffers from the need for transistors with closely selected characteristics and an inability to operate through a wide temperature range, even with close selection of transistor characteristics. This handicap results primarily from a variation in the amplification factors of various transistors.

The voltage of output terminal 74 is quite straightforward in that it is simply $300-I_{18}R_{18}$ (where $I_{18}$ and $R_{18}$ are the current through, and the impedance of resistor 18). The voltage at point 21 between transistors 20 and 22 is approximately equal to $200-I_{54}R_{54}$ (where $I_{54}$ and $R_{54}$ are the current through, and the impedance of resistor 54), since the voltage drop between the base and emitter of transistor 20 is quite small, on the order of 0.5 volt for a silicon transistor. The current in the base of transistor 20 is equal to $(1-\alpha)I_e$, where $I_e$ is the emitter current of transistor 20 and $\alpha$ is the grounded base current gain of the transistor. It can be seen that small changes in $\alpha$ will have a large effect on the base current of the transistor and, consequently, the voltage between transistors 20 and 22.

Likewise, the voltage between transistors 22 and 24 is determined by the difference between the 100 volt reference point 56 and the drop produced by the base current of transistor 22 through resistor 58. The range of direct current $\alpha$ for a representative transistor may be from 0.90 to 0.95. For this range of $\alpha$, $1-\alpha$ can vary from .05 to .10, or a ratio of 2 to 1. Consequently, without special selection of transistors at 25° C., the voltages between the various transistors may vary by 2 to 1. Likewise, with a change in temperature, the quiescent voltages could be expected to drift severely with a change in $\alpha$.

Figure 2:
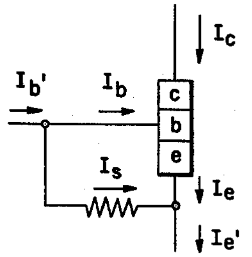
FIG. 2 is an illustration of a transistor having its emitter and base shunted to stabilize the gain of the transistor.

As was stated above, the grounded base current gain $\alpha$ of a representative transistor varies from 0.90 to 0.95 while $(1-\alpha)$ varies from 0.05 to 0.10. It can be readily seen that the operation of the amplifier will be much less affected by variations if the voltages could be made more of a direct function of $\alpha$ rather than $1-\alpha$. This will be seen to be possible from the following consideration of transistor characteristics. Consider the effect of shunting current around the path from base to emitter as shown in FIG. 2.

Consider a transistor with $$\alpha=\frac{I_c}{I_e}=0.95$$

Without shunting for $I_e=20$, $I_b=1$, and $I_c=19$.
Let us say that $I_s=2$ and $I_{e'}=20$.
Under these conditions $I_{b'}=3$ and $I_c=17$.
The equivalent $\alpha$ of the unit is now $$\alpha'=\frac{I_c}{I_{e'}}=\frac{17}{20}=0.85$$

It can be seen that while increasing $I_{b'}$ to 300% of its original value the current gain has been degenerated by only $$\frac{.95-.85}{.95}=10.5\%$$

Figure 3:
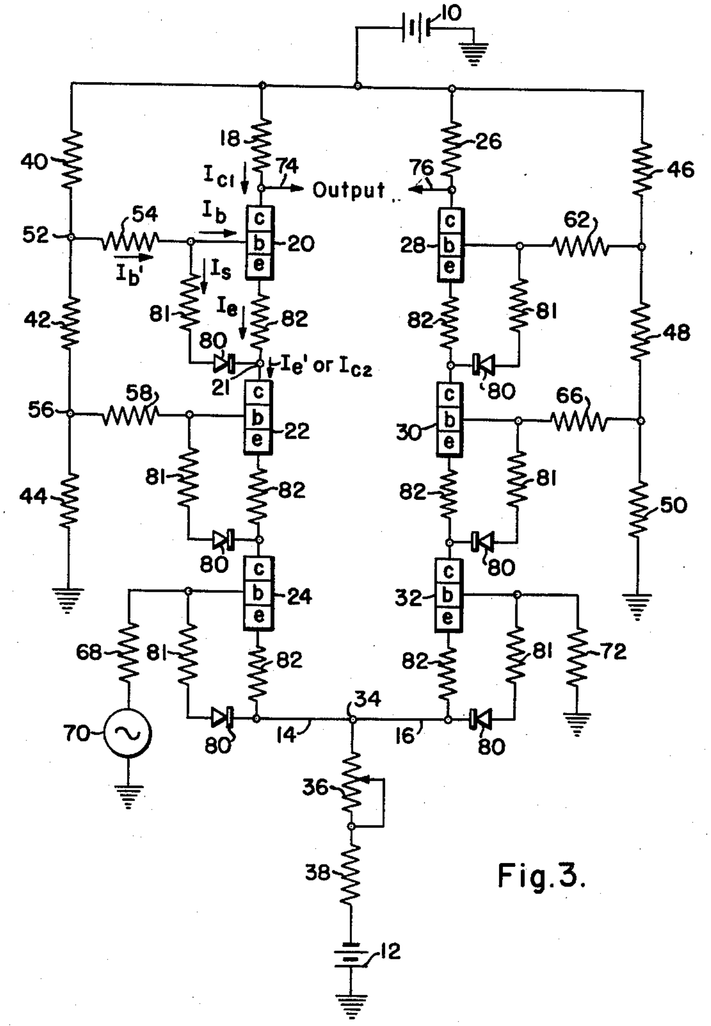
FIG. 3 is a schematic circuit diagram of the invention according to the preferred embodiment thereof and employing means for maintaining the amplification factors of the transistors employed in the amplifier constant.

From the above considerations, it can be seen that the currents through resistors 54 and 58 in FIG. 3 can be made dependent upon the collector current of the preceding transistor without seriously degenerating the gain of the amplifier.

Consideration of the problem involved leads to the conclusion that a circuit such as that shown in FIG. 3 would be required. Referring to FIG. 3, it can be seen that the basic circuit is somewhat similar to that shown in FIG. 1; and, accordingly, elements in FIG. 3 which correspond to elements shown in FIG. 1 are indicated by like reference numerals.

Considering transistors 20 and 22 in FIG. 3, transistor 22 can be considered as a constant current source for transistor 20 because of its high output impedance. The division of $I_{c2}$ between the shunt path and the emitter path will, therefore, be inversely proportional to the resistance of each leg. The emitter-to-base resistance of the transistor 20 is made up of a so-called "threshold" voltage of approximately 0.5 volt plus a relatively low dynamic resistance. In order to assure a limited constant ratio of shunt current to emitter current, a diode 80 is placed in the shunt leg of each of the transistors, which includes the shunt resistance 81. In addition, to eliminate variations in emitter dynamic resistance of the transistors, an external resistance 82 is added to the emitter leg of each of the transistors. The ratio of the shunt current to emitter current is now approximately equal to $$\frac{R_{82}}{R_{81}}$$

As an example of the effectiveness of this technique, consider transistor 22 and the voltage between transistors 20 and 22 in the circuit of FIG. 3. As a starting point, assume that the ratio of $R_{82}$ to $R_{81}$ is 0.2. The value of $R_{82}$ will be 2,000 ohms. Therefore, $$R_{81}=\frac{R_{82}}{.2}=10,000$$

$$\text{For } \alpha=.95\ I_{c1}=1\text{ ma., } I_e=\frac{1.0}{.95}=1.05$$

$$I_b=.05\text{ ma., } I_s=0.2\times1.05=.210\text{ ma.}$$
$$I_b=.260\text{ ma.}$$

$$\text{For } \alpha=.90\ I_{c1}=1\text{ ma., } I_e=\frac{1.0}{.9}=1.11\text{ ma.}$$

$$I_b=.11\text{ ma., } I_s=.2\times1.11=.222\text{ ma.}$$
$$I_{b'}=.332\text{ ma.}$$

The median value of $$I_{b'}=\frac{.260+.332}{2}=\frac{.592}{2}=.296$$

$$R_{54}=\frac{200-100}{.296\times10}-3=338\text{K.}$$

for the desired voltage of 100 volts at point 21 in FIG. 3.

As a check, the voltage at point 21 for an $\alpha$ of .95 is:

$$V_{21}=200-I_{b'}R_{54}$$
$$V_{21}=200-.260\times10^{-3}\times338\times10^3$$
$$=200-88=112\text{ volts}$$

For an $\alpha$ of .90, $V_{21}=200-332\times10^{-3}\times338\times10^3$
$=200-112=88$ volts Thus, the maximum voltage change at point 21 is only 24 volts. In addition to the advantages described above, it will be seen that the shunting described will improve the stability of the circuit under changes in ambient temperature since the major change in transistor parameters will be in direct current gain.

Although the invention has been described in connection with a specific embodiment, it will be readily apparent to those skilled in the art that various changes in form and arrangement of parts may be made to suit requirements without departing from the spirit and scope of the invention. In this respect, it will be obvious that p-n-p transistors could be readily used in the circuit by reversing the polarities of batteries 10 and 12, and diodes 80. In this latter case, transistor 24 would, of course, respond to negative input signals rather than positive signals. It will also be apparent that the use of three transistors in the paths 14 and 16 is for illustrative purposes only and that any number of transistors may be used in each path, depending upon requirements.

I claim as my invention:

1. An amplifier comprising, in combination, a source of direct current energizing potential, first circuit means including a coupling impedance and a first plurality of transistors connected in series across said source of potential, all of said transistors being of the same type and each having an emitter, a collector and a base, the first circuit means including a resistor connected to the emitter of each transistor therein, the emitter of one transistor being operatively connected to the collector of the next succeeding transistor, through the emitter resistor of said next succeeding transistor, a first plurality of shunting circuit means each including a forward biased diode and a shunting resistor, one shunting circuit means being connected across each series-connected resistor and emitter-base path of the first circuit means, second circuit means including said coupling impedance and a second plurality of transistors connected in series across said source of potential, said coupling impedance being common to both the first and second circuit means, said second plurality of transistors being of the same type as the type of said first plurality of transistors and each having an emitter, a collector and a base, the second circuit means including a resistor connected to the emitter of each transistor therein, the emitter of one transistor of the second plurality being operatively connected to the collector of the next succeeding transistor of said second plurality, through the emitter resistor of said next succeeding transistor, a second plurality of shunting circuit means each including a forward biased diode and a shunting resistor, one shunting circuit means being connected across each series-connected resistor and emitter-base path of the second circuit means, means including resistor means carrying base currents operatively connected to the first and second plurality of transistors for applying a plurality of different bias voltages to the bases of the transistors of said first and second plurality of transistors whereby the emitter-to-collector voltage drops across the transistors are substantally equal, each of said plurality of bias voltages including a voltage drop across resistor means carrying base current, means for applying a signal to be amplified between the emitter and base of said next succeeding transistor of said first plurality transistors whereby the collector-to-emitter impedances of all of the transistors of the first plurality of transistors vary in the same sense in accordance with variations in the signal to be amplified, variations in the collector-to-emitter impedances of the transistors of the first plurality of transistors as a result of said coupling impedance being accompanied by corresponding variations in the opposite sense in the collector-to-emitter impedances of the transistors of the second plurality of transistors, and output means connected to the first and second circuit means at corresponding circuit points therein, the first plurality of shunting circuit means stabilizing the amplification factors of the first plurality of transistors respectively, the second plurality of shunting circuit means stabilizing the amplification factors of the second plurality of transistors respectively.

2. A transistor amplifier comprising, in combination, a source of direct current potential, first circuit means providing a first current path and including a coupling impedance and a first plurality of transistors connected in series across said source of potential, all of said transistors being of the same type and each having an emitter, a collector and a base, the first circuit means including a resistor connected to the emitter of each transistor therein, the emitter resistor of one transistor being operatively connected to the collector of the next succeeding transistor, a first plurality of shunting circuit means each including a forward biased diode and a shunting resistor, one shunting circuit means being connected across each series-connected resistor and emitter-base path of the first circuit means, second circuit means providing a second current path and including said coupling impedance and a second plurality of transistors connected in series across said source of potential, said coupling impedance being common to both said first and second circuit means, said second plurality of transistors being of the same type as the type of first plurality of transistors, each of said second plurality of transistors having an emitter, a collector and a base, the second circuit means including a resistor connected to the emitter of each transistor therein, the emitter resistor of one transistor of the second plurality of transistors being operatively connected to the collector of the next succeeding transistor, a second plurality of shunting circuit means each including a forward biased diode and a shunting resistor, one shunting circuit means being connected across each series-connected resistor and emitter-base path of the second circuit means, means including resistor means carrying base currents operatively connected to the first and second plurality of transistors for applying a plurality of different bias voltages to the bases of the transistors of the first and second plurality of transistors whereby the emitter-to-collector voltage drops across the transistors are substantially equal, each of said plurality of bias voltages including a voltage drop across resistor means carrying base current, means for applying a signal to be amplified between the emitter and base of said next succeeding transistor of said first plurality of transistors whereby the collector-to-emitter impedances of all of the transistors of said first plurality vary in a predetermined sense, the variations in the collector-to-emitter impedances of the first plurality of transistors as a result of said coupling impedance being accompanied by variations in the opposite sense in the collector-to-emitter impedances of the transistors of the second plurality of transistors whereby a potential difference is caused to exist between corresponding points in the first current path and the second current path, and output means connected to the first circuit means and second circuit means at said corresponding points, the resistors in series with the emitters of the transistors of the first and second plurality of transistors minimizing the effect on the gains of the transistors of variations in the emitter dynamic resistances of the transistors.

3. A stabilized transistor amplifier comprising, in combination, a source of direct current energizing potential having positive and negative terminals and having a potential point intermediate said positive and negative terminals connected to a common circuit point, a load resistor, a first transistor having a collector, base, and emitter, a first resistor, a second transistor having a collector, base and emitter, a second resistor, coupling impedance means, first circuit means connecting the load resistor, first transistor, first resistor, second transistor, second resistor and coupling impedance means in series in the order named between said positive and negative terminals whereby the collector of the first transistor is connected to said load resistor, the emitter of the first transistor is connected by way of the first resistor to the collector of the second transistor, and the emitter of the second transistor is connected to the second resistor, the load resistor being connected to a selected terminal of said source, an additional load resistor connected to said selected terminal, a third transistor having a collector, base, and emitter, a third resistor, a fourth transistor having a collector, base, and emitter, a fourth resistor, other circuit means connecting the additional load resistor, third transistor, third resistor, fourth transistor, and fourth resistor in series in the order named between said selected terminal of said source of direct current potential and the junction between the second resistor and the coupling impedance means whereby the collector of the third transistor is connected to the additional load resistor, the emitter of the third transistor is connected by way of the third resistor to the collector of the fourth transistor, and the emitter of the fourth transistor is connected to the fourth resistor, the coupling impedance means being common to the current path through the first and second transistors and to the current path through the third and fourth transistors and providing coupling between the first circuit means and the other circuit means, a first diode and a first shunting resistor in series therewith operatively connecting the base of the first transistor to the collector of the second transistor, the first diode being poled in a manner whereby the first diode is forward biased, a second diode and a second shunting resistor in series therewith operatively connecting the base of the second transistor to the circuit means at the junction between the second resistor and the coupling impedance means, the second diode being poled in a manner whereby the second diode is forward biased, a third diode and a third shunting resistor in series therewith operatively connecting the base of the third transistor to the collector of the fourth transistor, the third diode being poled in a manner whereby the third diode is forward biased, a fourth diode and a fourth shunting resistor in series therewith operatively connecting the base of the fourth transistor to the other circuit means at the junction between the fourth resistor and the coupling impedance means, the fourth diode being poled in a manner whereby the fourth diode is forward biased, a first voltage dropping network interconnected between said selected terminal of said source and said common circuit point, a biasing resistor connecting the base of the first transistor to a preselected point on the first voltage dropping network, a second voltage dropping network connecting said last named terminal to said common circuit point, an additional biasing resistor connecting the base of the third transistor to a preselected point on said second voltage dropping network, resistance means connecting the base of the fourth transistor to said common circuit point, means for applying a signal to be amplified between said common circuit point and the base of the second transistor, and means operatively connected to the collector of the first transistor and to the collector of the third transistor for obtaining an output signal developed therebetween, the first, second, third, and fourth diodes providing for substantially constant ratios of shunt current to emitter current in the first, second, third, and fourth transistors respectively, the values of the first, second, third and fourth resistors being made large with respect to the emitter dynamic resistances of the first, second, third, and fourth transistors respectively to reduce the effects of variations in the emitter dynamic resistances.

4. A stabilized transistor amplifier comprising, in combination, a source of direct current energizing potential having positive and negative terminals and having a potential point intermediate said positive and negative terminals connected to a common circuit point, a load resistor, a first transistor having a collector, base, and emitter, a first resistor, a second transistor having a collector, base, and emitter, a second resistor, coupling impedance means, circuit means connecting the load resistor, first transistor, first resistor, second transistor, second resistor and coupling impedance means in series in the order named between said positive and negative terminals whereby the collector of the first transistor is connected to said load resistor, the emitter of the first transistor is connected by way of the first resistor to the collector of the second transistor, and the emitter of the second transistor is connected to the second resistor, the load resistor being connected to a selected terminal of said source, an additional load resistor connected to said selected terminal, a third transistor having a collector, base, and emitter, a third resistor, a fourth transistor having a collector, base, and emitter, a fourth resistor, additional circuit means connecting the additional load resistor, third transistor, third resistor, fourth transistor and fourth resistor in series in the order named between said last named terminal of said source of direct current potential and the junction between the second resistor and the coupling impedance means whereby the collector of the third transistor is connected to the additional load resistor, the emitter of the third transistor is connected by way of the third resistor to the collector of the fourth transistor, and the emitter of the fourth transistor is connected to the fourth resistor, the coupling impedance means being common to the current path throught the circuit means and the additional circuit means and providing coupling therebetween, a first forward biased diode and a first shunting resistor in series therewith operatively connecting the base of the first transistor to the collector of the second transistor, a second forward biased diode and a second shunting resistor in series therewith operatively connecting the base of the second transistor to the circuit means at the junction between the second resistor and the coupling impedance means, a third forward biased diode and a third shunting resistor in series therewith operatively connecting the base of the third transistor to the collector of the fourth transistor, a fourth forward biased diode and a fourth shunting resistor in series therewith operatively connecting the base of the fourth transistor to the additional circuit means at the junction between the fourth resistor and the coupling impedance means, resistance voltage dropping network means connecting said selected terminal of said source to said common circuit point, a biasing resistor connecting the base of the first transistor to a preselected point on said resistance voltage dropping network means, an additional biasing resistor connecting the base of the third transistor to a preselected point on said resistance voltage dropping network means, resistance means operatively connecting the base of the fourth transistor to said common circuit point, means for applying a signal to be amplified between said common circuit point and the base of the second transistor, and means operatively connected to the collector of the first transistor and to the collector of the third transistor for obtaining an output signal developed therebetween, the value of the first resistor being large compared to the emitter dynamic resistance of the first transistor to minimize the effect of variations in the emitter dynamic resistance of the first transistor with changes in the transistor characteristics, the first diode insuring a substantially constant ratio of shunt current through the first shunting resistor to emitter current through the first resistor thereby stabilizing the amplification factor of the first transistor, the value of the second resistor being large compared to the dynamic emitter resistance of the second transistor to minimize the effect of variations in the dynamic emitter resistance of the second transistor, the second diode insuring a substantially constant ratio of shunt current through the second shunting resistor to emitter current through the second resistor thereby stabilizing the amplification factor of the second transistor, the value of the third resistor being large compared to the emitter dynamic resistance of the third transistor to minimize the effect of variations in the emitter dynamic resistance of the third transistor, the third diode insuring a substantially constant ratio of shunt current to emitter current in the third transistor thereby stabilizing the amplification factor of the third transistor, the value of the fourth resistor being large compared to the emitter dynamic resistance of the fourth transistor to minimize the effects of variations in the value of the emitter dynamic resistance of the fourth transistor, the fourth diode insuring a substantially constant ratio of shunt current to emitter current in the fourth transistor thereby stabilizing the amplification factor of the fourth transistor.

5. A stabilized transistor amplifier comprising, in combination, a source of direct current energizing potential having positive and negative terminals and having a potential point intermediate said positive and negative terminals connected to a common circuit point, a load resistor, a first transistor having a collector, base, and emitter, a first resistor, a second transistor having a collector, base and emitter, a second resistor, coupling impedance means, first circuit means connecting the load resistor, first transistor, first resistor, second transistor, second resistor and coupling impedance means in series in the order named between said positive and negative terminals whereby the collector of the first transistor is connected to said load resistor, the emitter of the first transistor is connected by way of the first resistor to the collector of the second transistor, and the emitter of the second transistor is connected to the second resistor, the load resistor being connected to a selected terminal of said source, an additional load resistor connected to said selected terminal, a third transistor having a collector, base, and emitter, a third resistor, a fourth transistor having a collector, base, and emitter, a fourth resistor, other circuit means connecting the additional load resistor, third transistor, third resistor, fourth transistor, and fourth resistor in series in the order named between said selected terminal of said source of direct current potential and the junction between the second resistor and the coupling impedance means whereby the collector of the third transistor is connected to the additional load resistor, the emitter of the third transistor is connected by way of the third resistor to the collector of the fourth transistor, and the emitter of the fourth transistor is connected to the fourth resistor, the coupling impedance means being common to the current path through the first and second transistors and to the current path through the third and fourth transistors and providing coupling between the first circuit means and the other circuit means, a first forward biased diode and a first shunting resistor in series therewith operatively connecting the base of the first transistor to the collector of the second transistor, a second forward biased diode and a second shunting resistor in series therewith operatively connecting the base of the second transistor to the circuit means at the junction between the second resistor and the coupling impedance means, a third forward biased diode and a third shunting resistor in series therewith operatively connecting the base of the third transistor to the collector of the fourth transistor, a fourth forward biased diode and a fourth shunting resistor in series therewith operatively connecting the base of the fourth transistor to the other circuit means at the junction between the fourth resistor and the coupling impedance means, base biasing means for all of the transistors including a resistor in the base current path of each transistor, means for applying a signal to be amplified between said common circuit point and the base of the second transistor, and means operatively connected to the collector of the first transistor and to the collector of the third transistor for obtaining an output signal developed therebetween.

6. In a stabilized transistor amplifier employing a plurality of series-connected transistors in which the emitter of one transistor is operatively connected to the collector of the next succeeding transistor and in which the bases of the transistors are biased at least in part by voltage drops across resistors connected to the bases and carrying base currents, the improvement which comprises a stabilizing resistor connected in series with the emitter of each transistor, the stabilizing resistor having a value large in comparison with the dynamic emitter resistance of the transistor to reduce the effect of variations in the dynamic emitter resistance on the gain of the amplifier, and shunting circuit means including a series-connected shunting resistor and forward biased diode connected from the base of each transistor in parallel with the current path through the stabilizing resistor and emitter-base junction of the transistor, the diode and shunting resistor insuring a substantially constant ratio of shunt current to emitter current, the shunt current reducing the effective amplification factor $\alpha$ of the transistor whereby the effects on the gain of the amplifier of variations in $\alpha$ are reduced, the value of the shunting resistor being selected in accordance with the value of the stabilizing resistor to provide a predetermined ratio of shunt current to emitter current.

References Cited in the file of this patent

UNITED STATES PATENTS

| | | |
|---|---|---|
| 2,424,893 | Mansford | July 29, 1947 |
| 2,620,448 | Wallace | Dec. 2, 1952 |
| 2,631,198 | Parisoe | Mar. 10, 1953 |
| 2,740,847 | Cahill | Apr. 3, 1956 |
| 2,802,071 | Lin | Aug. 6, 1957 |
| 2,811,590 | Doremus et al. | Oct. 29, 1957 |
| 2,847,583 | Lin | Aug. 12, 1958 |
| 2,888,525 | Eckess | May 26, 1959 |
| 2,926,307 | Ehret | Feb. 23, 1960 |
| 2,929,997 | Cluwen | Mar. 22, 1960 |

OTHER REFERENCES

Slaughter: "The Emitter-Coupled Differential Amplifier," IRE Transactions-Circuit Theory, March 1956, pages 51–53.

Sheatext: "Principles of Transistor Circuits," September 1953, pages 177–179.